United States Patent
Chen et al.

(10) Patent No.: US 8,330,522 B2
(45) Date of Patent: Dec. 11, 2012

(54) MIXER FOR CANCELING SECOND-ORDER INTER-MODULATION DISTORTION AND ASSOCIATED TRANSCONDUCTOR CIRCUIT

(75) Inventors: Min-Chiao Chen, Hsinchu Hsien (TW); Shuo Yuan Hsiao, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 16 days.

(21) Appl. No.: 13/005,642

(22) Filed: Jan. 13, 2011

(65) Prior Publication Data
US 2012/0019304 A1 Jan. 26, 2012

(30) Foreign Application Priority Data
Jul. 22, 2010 (TW) ................................ 99124203 A

(51) Int. Cl.
*G06F 7/44* (2006.01)
(52) U.S. Cl. ........................................ 327/358; 327/359
(58) Field of Classification Search ........................ None
See application file for complete search history.

(56) References Cited

U.S. PATENT DOCUMENTS

| | | | | |
|---|---|---|---|---|
| 5,221,909 A * | 6/1993 | Cole | ............................. | 330/253 |
| 6,594,504 B1 * | 7/2003 | Grasset | ...................... | 455/550.1 |
| 7,280,815 B2 * | 10/2007 | Pellat et al. | .................... | 455/326 |
| 7,773,969 B2 * | 8/2010 | Simon | ........................... | 455/333 |
| 7,973,587 B2 * | 7/2011 | Yang et al. | ..................... | 327/359 |
| 2005/0174167 A1 * | 8/2005 | Vilander et al. | ............... | 327/560 |
| 2008/0042726 A1 * | 2/2008 | Belot et al. | ..................... | 327/356 |
| 2008/0180156 A1 * | 7/2008 | Yang et al. | ..................... | 327/359 |
| 2010/0327941 A1 * | 12/2010 | Jansen et al. | .................. | 327/359 |

* cited by examiner

*Primary Examiner* — Tuan T Lam
(74) *Attorney, Agent, or Firm* — Edell, Shapiro & Finnan, LLC

(57) ABSTRACT

A transconductor circuit used in a mixer for canceling second-order inter-modulation distortion includes a first transistor and a second transistor, of which the base (gate) ends coupled to a first input end and a second input end, for receiving a differential input signal; and a negative feedback circuit, of which the input end coupled to the emitter (source) ends of the first transistor and the second transistor, of which the out end coupled to the base (gate) ends of the first transistor and the second transistor, for adjusting the voltage of the base (gate) of the first transistor and the second transistor according to the difference between a reference voltage and the detected voltage of the emitter (source) of the first transistor and the second transistor.

20 Claims, 4 Drawing Sheets

US 8,330,522 B2

MIXER FOR CANCELING SECOND-ORDER INTER-MODULATION DISTORTION AND ASSOCIATED TRANSCONDUCTOR CIRCUIT

CROSS REFERENCE TO RELATED PATENT APPLICATION

This patent application is based on Taiwan, R.O.C. patent application No. 99124203 filed on 22 Jul. 2010.

FIELD OF THE INVENTION

The present invention relates to a mixer, and more particularly, to a mixer and associated transconductor circuit, used in a direct conversion receiver for canceling Second-order Inter-Modulation Distortion (IM2).

BACKGROUND OF THE INVENTION

In wireless transceiver, the mixer is widely used to be a frequency conversion element. FIG. 1 shows a direct conversion receiver 10, comprising an antenna 11, a Low-Noise Amplifier (LNA) 12, a mixer 13, a Local Oscillator (LO) 14, a Low Pass Filter (LPF) 15 and an amplifier 16. A Radio Frequency (RF) signal is received by the antenna 11, and amplified by the LNA 12, then down-converted to a baseband signal directly by the mixer 13. Thereafter, the baseband signal is filtered by LPF 15 and amplified by the amplifier 16, then sent to the backend circuit for Analog-Digital Conversion (not shown). The LO 14 generates an oscillation signal, of which the frequency is $f_{LO}$, and the frequency $f_{LO}$ is a RF carrier frequency supplied to the mixer 13 for converting the RF signal to the baseband signal directly. The direct conversion receiver 10 need not convert the RF signal to an Intermediate Frequency (IF) signal and then convert the IF signal to the baseband signal, so it is also referred to as a "Zero-IF Receiver." Because there is no IF conversion, the direct conversion receiver 10 has two important advantages besides saving a set of mixers. One advantage is that there is no image signal interference, and thus an Image-Rejection Filter is not needed. The other advantage is that the Low Pass Filter (LPF) 15 and the amplifier 16 may be integrated into a single IC and replace an external Surface Acoustic Wave filter (SAW filter) required by a traditional receiver. Therefore, the direct conversion receiver 10 has several advantages including higher integration, lower complexity and lower cost.

But the direct conversion receiver 10 also has some disadvantages, such as second-order inter-modulation distortion, DC offset, flick noise, etc. The second-order inter-modulation distortion is mainly caused by feedtrough, as shown in FIG. 2A. Two strong interference signals are very close to the receiving channel, and they are all in the range of the band-pass filter. An interference signal around the DC is generated when the two interference signals pass through the low noise amplifier (LNA) 211. Then, the interference signal around the DC passes through a mixer 212. If the mixer 212 is an ideal mixer, the interference signal around the DC will be converted into a higher spectrum by the mixer 212. But an actual mixer has feedtrough, so that the output of the mixer 212 includes an interference signal around the DC. As shown in FIG. 2B, the LO leakage is inputted to the LNA 221 and the mixer 222 because isolation between the components is not perfect. Therefore, a DC offset will be generated and interfere with the baseband signal. In addition, the non-linear characteristic and low frequency conversion gain of the transconductor circuit in a mixer also strengthen the IM2 effect. Therefore, it is an important issue to cancel IM2 when designing a direct conversion receiver. The present disclosure provides a negative feedback circuit for adjusting the input signal of the transconductor circuit in a mixer to overcome this problem.

FIG. 3 shows a Gilbert mixer circuit in accordance with the prior art. The Gilbert mixer 30 comprises a transconductor circuit 31, a switch quad circuit 32 and a load circuit 33. The load circuit 33 includes two parallel connected resistors $R_{C1}$, $R_{C2}$. More specifically, the first ends of the resistor $R_{C1}$ and the resistor $R_{C2}$ are coupled to a voltage source Vcc, and the second ends of the resistor $R_{C1}$ and the resistor $R_{C2}$ are respectively coupled to the differential out ends of the switch quad circuit 32. The switch quad circuit 32 includes NPN bipolar junction transistors (BJT) Q3, Q4, Q5, Q6. Specifically, the collector of the BJT Q3 and the collector of the BJT Q5 are coupled to the second end of the resistor $R_{C1}$, and the collector of the BJT Q4 and the collector of the BJT Q6 are coupled to the second end of the resistor $R_{C2}$. Furthermore, the base end of the BJT Q3 is coupled to the base end of the BJT Q6, and the base end of the BJT Q4 is coupled to the base end of the BJT Q5. Differential LO signals $f_{LO}$ are respectively inputted to the base ends of the BJT Q3 and the BJT Q4. Moreover, the emitter end of the BJT Q3 is coupled to the emitter end of the BJT Q4 to form a first current path, and the emitter end of the BJT Q5 is coupled to the emitter end of the BJT Q6 to form a second current path.

The transconductor circuit 31 includes NPN BJTs Q1, Q2. Specifically, the collector end of the BJT Q1 is coupled to the first current path of the switch quad circuit 32, and the collector end of the BJT Q2 is coupled to the second current circuit of the switch quad circuit 32. The base ends of the BJTs Q1 and Q2 respectively receive the voltage signal Vin$^+$ and Vin$^-$. Furthermore, the emitter ends of the BJTs Q1 and Q2 are respectively coupled to first ends of the resistors $R_{E1}$ and $R_{E2}$. The second or other ends of the resistors $R_{E1}$ and $R_{E2}$ are coupled to ground.

The transconductor circuit 31 transforms the input voltage Vin (i.e., differential input signals Vin$^+$ and Vin$^-$) to the current signal Ib. The current signal Ib is transformed to a frequency-converted current signal by the first current path and the second current path of the switch quad circuit 32 controlled by the local oscillation signal $f_{LO}$. Then, the frequency-converted current signal is transformed to an output voltage at the out end of the circuit.

Because the transconductor circuit 31 consists of NPN BJTs Q1, Q2, the relationship curve between the voltage and the current is an exponential curve, and not a linear curve. Therefore, there will be IM2 current generated in the mixer, and external voltages will appear at the emitters of the BJTs Q1 and Q2, which are expressed as follows:

$$V_{E1\_IM2} = 1/\alpha_1 * I_{C1\_IM2} * R_{E1}$$

$$V_{E2\_IM2} = 1/\alpha_1 * I_{C2\_IM2} * R_{E2}$$

Wherein, $\alpha_1$ represents the common-base current gain of the BJT Q1; $\alpha_2$ represents the common-base current gain of the BJT Q2.

IM2 distortion causes serious interference to the original signal in the mixer. Therefore, it is an important issue to cancel the IM2 in a direct conversion receiver, and the present disclosure provides a negative feedback circuit for adjusting the input signal of the transconductor circuit in a mixer to resolve this problem.

SUMMARY OF THE INVENTION

In accordance with one embodiment of the present invention, a transconductor circuit is used in a mixer for canceling second-order inter-modulation distortion. The transconductor comprises a first transistor and a second transistor, and a negative feedback circuit. The first transistor and second transistor are used for receiving differential input signals, wherein the base (gate) ends of the first transistor and the second transistor are respectively coupled to a first input end and a second input end. The negative feedback circuit comprises an input end and an output end, and is used for adjusting the voltage of the base (gate) ends of the first and second transistors according to a difference between a reference voltage and a detected voltage between the emitter (source) ends of the first and second transistors, wherein the input end is coupled to the emitter (source) ends of the first and second transistors, and the output end is coupled to the base (gate) ends of the first and second transistors.

A mixer is used for canceling second-order inter-modulation distortion according to another embodiment. The mixer comprises a load circuit, a switch circuit, a transconductor circuit, and a negative feedback circuit. The switch circuit, coupled to the load circuit, comprises a first current path and a second current path. The transconductor comprises a first transistor and a second transistor, and is used for receiving a differential input signal, wherein the collector (drain) ends of the first and second transistors are respectively coupled to the first current path and the second current path and the base (gate) ends of the first and second transistors are respectively coupled to a first input end and a second input end. The negative feedback circuit, comprises an input end and an output end, and is used for adjusting the voltage of the base (gate) ends of the first and second transistors according to a difference between a reference voltage and a detected voltage of the emitter (source) ends of the first and second transistors, wherein the input end is coupled to the emitter (source) ends of the first and second transistors and the output end is coupled to the base (gate) ends of the first and second transistors.

The advantages and spirit related to the present invention can be further understood via the following detailed description and drawings.

DETAILED DESCRIPTION OF THE PREFERRED EMBODIMENT

Figure 1:
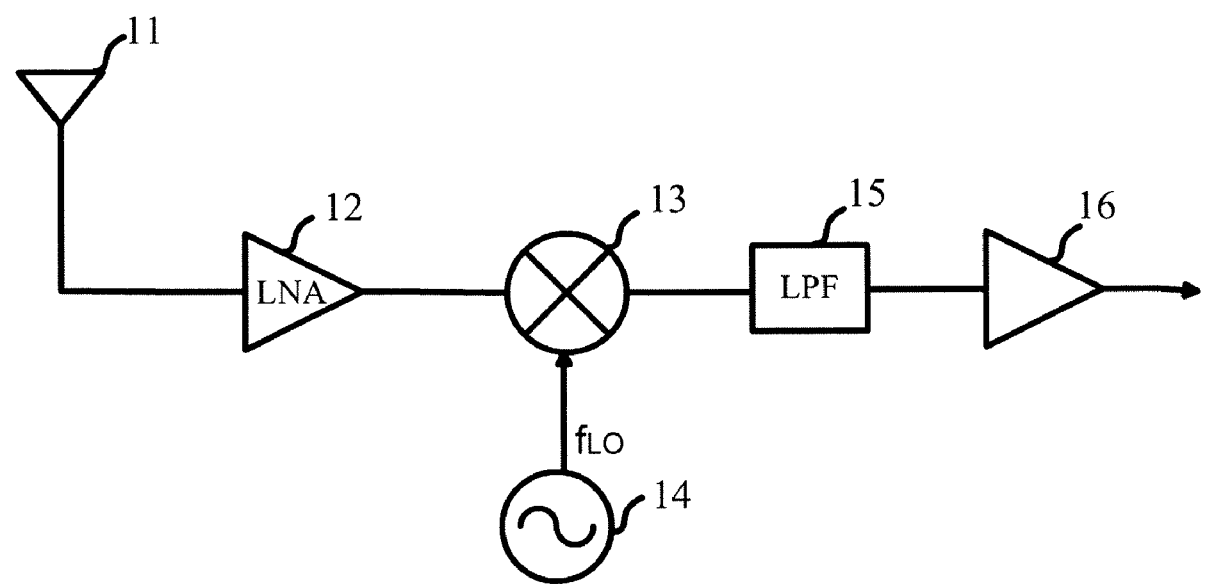
FIG. 1 is a schematic diagram of a direct conversion receiver.
Figure 2A:
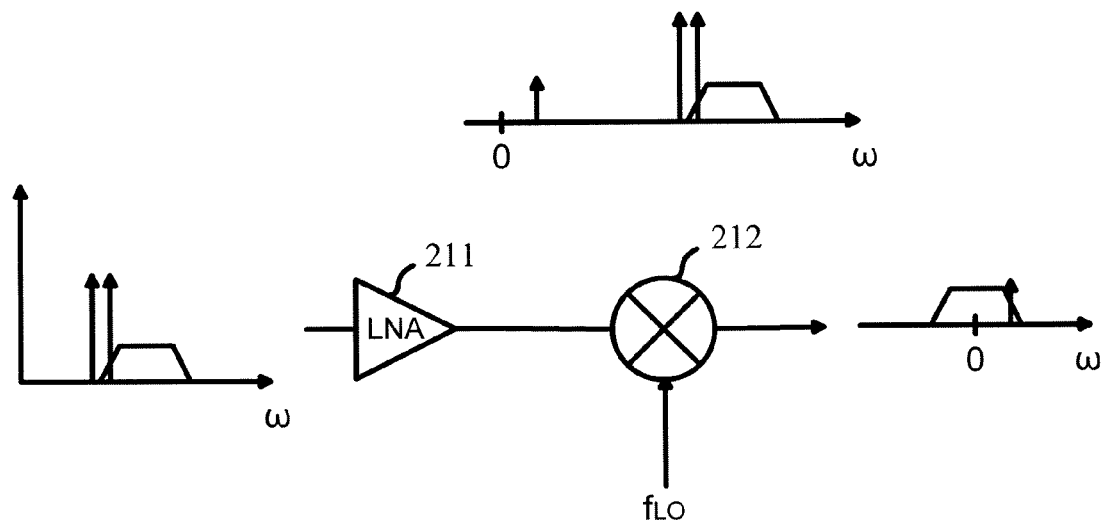
FIGS. 2A and 2B are schematic diagrams of second-order inter-modulation distortion.
Figure 2B:
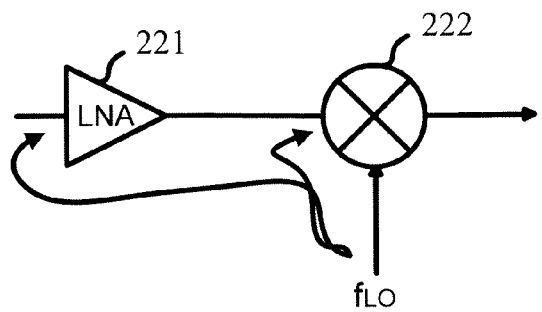
Figure 3:
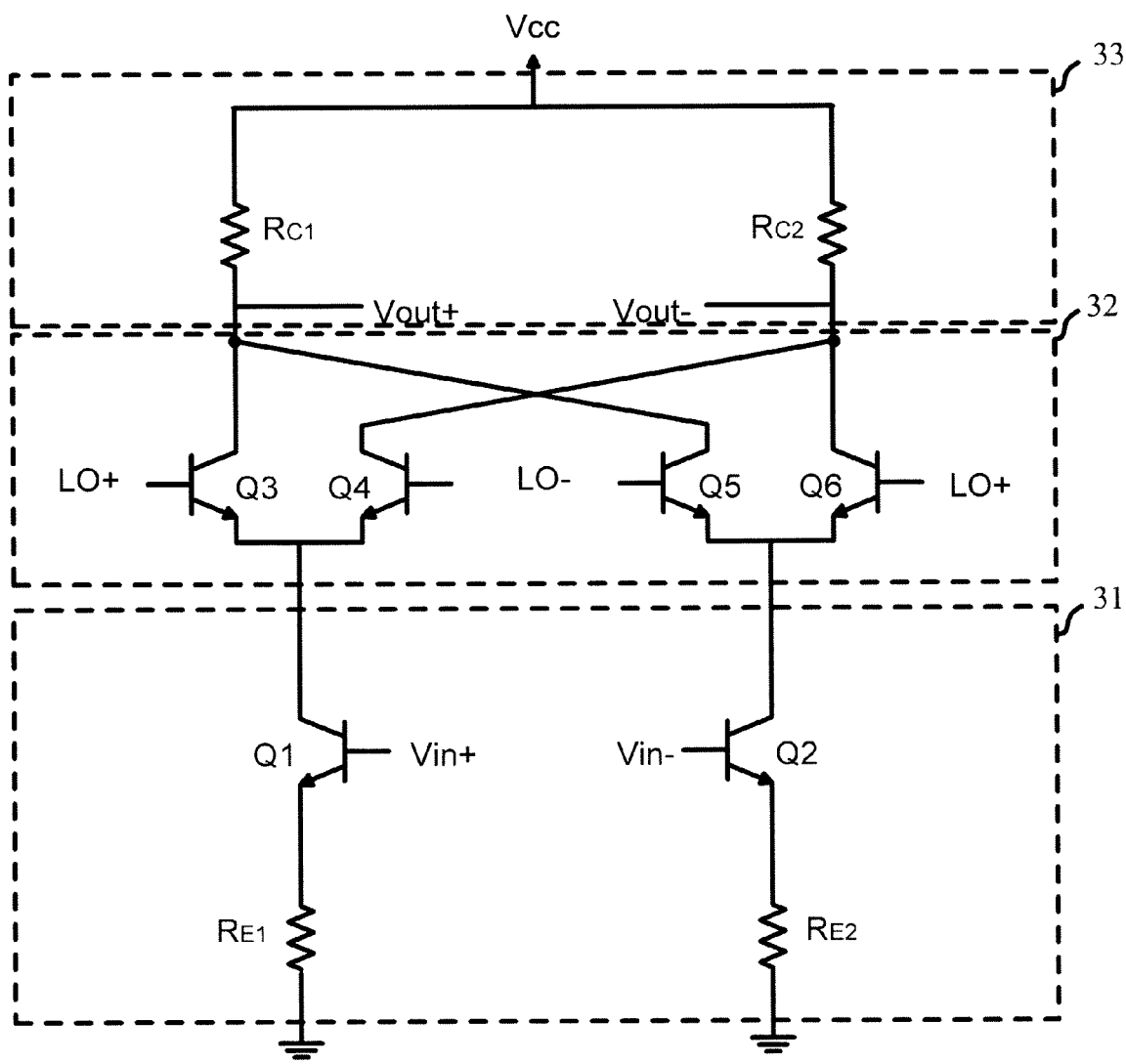
FIG. 3 is a circuit diagram of a mixer in accordance with the prior art.
Figure 4:
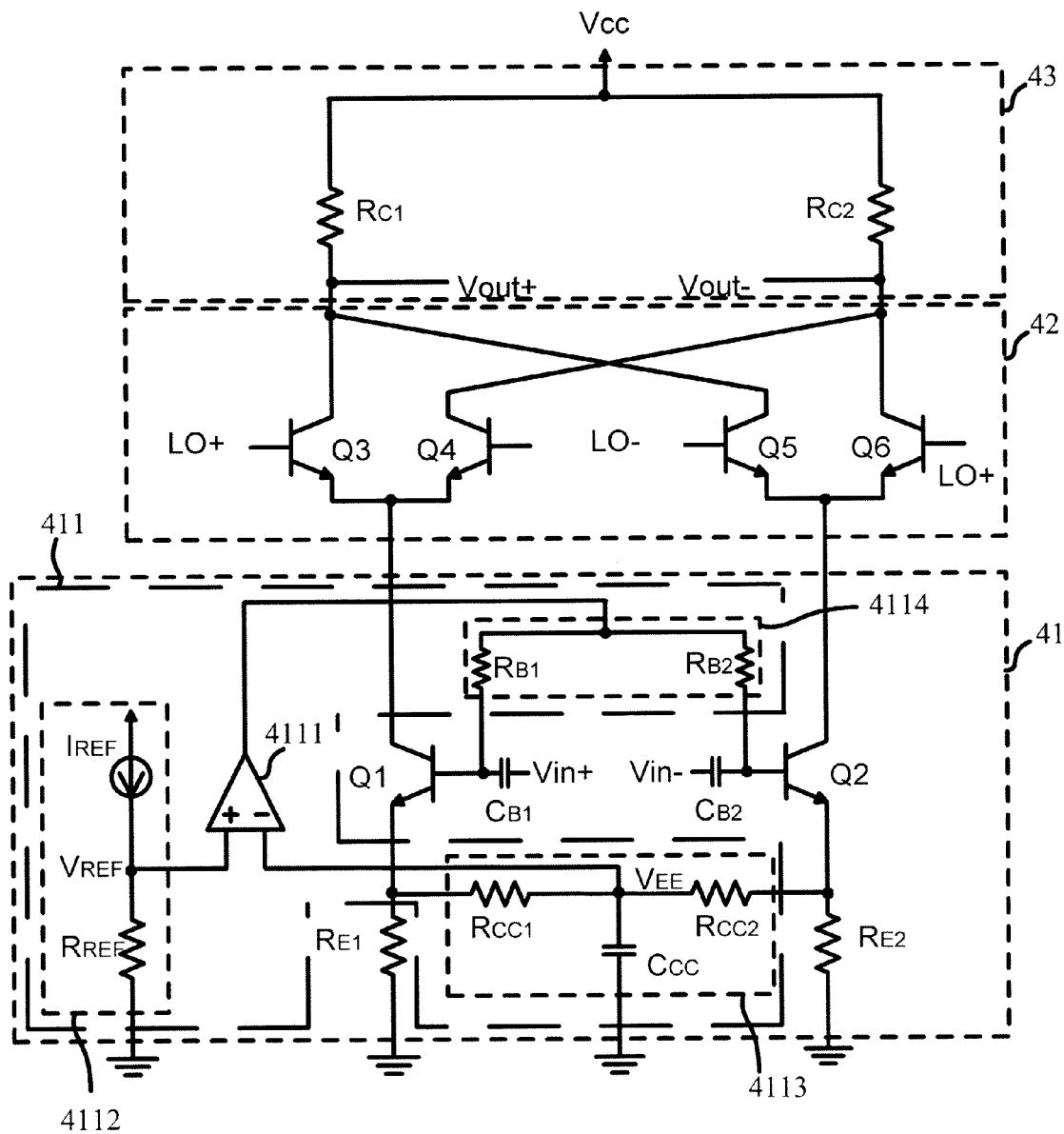
FIG. 4 is a schematic diagram of a circuit of a mixer according to an embodiment of the present disclosure.

FIG. 4 is a circuit diagram of a mixer of the present disclosure. The mixer 40 comprises a transconductor circuit 41, a switch circuit 42 and a load circuit 43. The load circuit 43 includes resistors $R_{C1}$ and $R_{C2}$. Specifically, the first ends of the two resistors $R_{C1}$ and $R_{C2}$ are coupled to a voltage source Vcc, and the second ends are coupled to the out end of the switch circuit 42. The switch circuit 42 includes NPN BJTs Q3, Q4, Q5 and Q6. The collector ends of the BJT Q3 and BJT Q5 are coupled to the second ends of the resistor $R_{C1}$, and the collector ends of the BJT Q4 and BJT Q6 are coupled to the second end of the resistor $R_{C2}$. Furthermore, the base end of BJT Q3 is coupled to the base end of the BJT Q6, and the base end of the BJT Q4 is coupled to the base end of the BJT Q5. Differential LO signals $f_{LO}$ are respectively inputted to the base ends of the BJT Q3 and the BJT Q4. Moreover, the emitter end of the BJT Q3 is coupled to the emitter end of the BJT Q4 to form a first current path, and the emitter end of the BJT Q5 is coupled to the emitter end of the BJT Q6 to form a second current path.

The transconductor circuit 41 includes NPN BJTs Q1 and Q2, resistors $R_{E1}$ and $R_{E2}$, capacitors $C_{B1}$ and $C_{B2}$, and a negative feedback circuit 411. The collector end of the BJT Q1 is coupled to the first current path of the switch circuit 42, and the collector end of the BJT Q2 is coupled to the second current circuit of the switch circuit 42. The base ends of the BJTs Q1 and Q2 are respectively coupled to first ends of the capacitors $C_{B1}$ and $C_{B2}$, and second ends of the capacitor $C_{B1}$ and $C_{B2}$ are respectively coupled to a differential input signal Vin$^+$ and Vin$^-$. The capacitors $C_{B1}$ and $C_{B2}$ are used for DC isolation from the mixer. Furthermore, the emitter ends of the BJTs Q1 and Q2 are respectively coupled to one end of the resistor $R_{E1}$ and $R_{E2}$, and the other ends of the resistors $R_{E1}$ and $R_{E2}$ are coupled to ground.

The negative feedback circuit includes an operational amplifier 4111, a reference voltage generating circuit 4112, a feedback voltage generating circuit 4113 and a bias circuit 4114. More specifically, the positive input end of the operational amplifier 4111 is coupled to a reference voltage $V_{REF}$ generated by the reference voltage generating circuit 4112, the negative input end of the operational amplifier 4111 is coupled to the feedback voltage generating circuit 4113, and the output end of the operational amplifier is coupled to the bias circuit 4114.

The reference voltage generating circuit 4112 is used for generating a reference voltage $V_{REF}$. If the components are matching, that is, the characteristic of the BJT Q1 is identical to that of the BJT Q2, and the resistor $R_{E1}$ is equal to the resistor $R_{E1}$, the reference voltage $V_{REF}$ is equal to the voltage of the emitter ends of the transistor Q1 and Q2, i.e. $V_{REF}=V_{E1}=V_{E2}$. In the preferred embodiment, the reference voltage generating circuit 4112 comprises of a reference current source $I_{REF}$ and a resistor $R_{REF}$ in series. The other end of the reference current source $I_{REF}$ is coupled to the voltage source Vcc, and the other end of the resistor $R_{REF}$ is coupled to the ground. In this situation, the equation of the reference voltage $V_{REF}$ is as $V_{REF}=I_{REF}*R_{REF}$. Taking the power consumption into consideration, the preferred embodiment can reduce the preset current value of the reference current source ($I_{REF}=1/n*I_{E1}=1/n*I_{E2}$) by using the larger resistor $R_{REF}$, such as $R_{REF}=nR_{E1}=n_{E2}$.

The feedback voltage generating circuit 4113 is used for detecting the average voltage between the emitter end of the BJT Q1 and the emitter end of the BJT Q2, and filtering out the RF signal and comprises resistors $R_{CC1}$ and $R_{CC2}$, and a capacitor $C_{CC}$. One end of the resistor $R_{CC1}$ is coupled to the emitter end of the BJT Q1, and the other end is coupled to the feedback voltage end $V_{EE}$. One end of the resistor $R_{Cc2}$ is coupled to the emitter end of the BJT Q2, and the other end is also coupled to the feedback voltage end $V_{EE}$. One end of the capacitor $C_{CC}$ is coupled to ground, and the other end is coupled to the feedback voltage end $V_{EE}$. Finally, the feedback voltage end $V_{EE}$ is coupled to the operational amplifier 4111. Assume $R_{CC1}$, $R_{CC2} \gg R_{E1}$, $R_{E2}$, the feedback voltage $V_{EE}$ is expressed as follows:

$$V_{EE} = \tfrac{1}{2}*(V_{E1\_IM2}+V_{E2\_IM2})$$

Wherein, $V_{E1\_IM2}=1/\alpha_1*I_{C1\_IM2}*R_{E1}$
$V_{E2\_IM2}=1/\alpha_2*I_{C2\_IM2}*R_{E2}$ The bias circuit 4114 is used for adjusting the input signal of the mixer to cancel the IM2. The bias circuit 4114 comprises resistors $R_{B1}$ and $R_{B2}$. One end of the resistor $R_{B1}$ is coupled to the base end of the BJT Q1, the other end is coupled to the output end of the operational amplifier 4111; and one end of the resistor $R_{B2}$ is coupled to the base end of the BJT Q2, the other end is coupled to the output end of the operational amplifier 4111. According to the adjusting signal from the operational amplifier, the bias circuit 4114 adjusts the differential input signals.

Therefore, assuming that the gain of the operational amplifier 4111 is $A_v$ in the IM2 frequency band, the common-emitter current gain β of the BJT Q1 is equal to that of the BJT Q2, $R_{E1}=R_{E2}=R_E$, and $R_B=R_{B2}=R_B$, the change of the collector current of the BJTs Q1 and Q2 caused by the operational amplifier 4111 can be expressed as follows:

$$I_{C1\_IM2\_Cancellation}=(-A_v\beta_{fb}/(1+A_v\beta_{fb}))*I_{C1\_IM2}$$

$$I_{C2\_IM2\_Cancellation}=(-A_v\beta_{fb}/(1+A_v\beta_{fb}))*I_{C2\_IM2}$$

Wherein, $$B_{fb}=((\beta+1)R_E)/(R_B+(\beta+1)(R_E+r_e))$$

β: the common-emitter current gain $r_e$: the small-signal equivalent resistor of the emitter ends of the BJTs Q1 and Q2.

According to the above equations, we can know that the mixer 40 of the present disclosure can cancel the IM2 by using the feedback voltage generating circuit 4113 to eliminate the additional input current resulted from the IM2.

The transistors in the embodiment are NPN BJTs. However, The transistors need not be limited to NPN BJTs. Those skilled in the art will appreciate that other components such as PNP BJTs, N-type FETs or P-type FETs may employed instead.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A transconductor circuit used in a mixer for canceling second-order inter-modulation distortion, comprising:
    a first transistor and a second transistor for receiving differential input signals, wherein the base (gate) ends of the first transistor and the second transistor are respectively coupled to a first input end and a second input end; and
    a negative feedback circuit having an input end and an output end, for adjusting the voltage at the base (gate) ends of the first and second transistors according to a difference between a reference voltage and a detected voltage between the emitter (source) ends of the first and second transistors, wherein the input end is coupled to the emitter (source) ends of the first and second transistors, and the output end is coupled to the base (gate) ends of the first and second transistors.

2. The transconductor circuit as claimed in claim 1, wherein the negative feedback circuit comprises:
    a reference voltage generating circuit, for generating the reference voltage determined by the emitter (source) voltages of the first and second transistors without considering second-order inter-modulation distortion influence;
    a feedback voltage generating circuit, for detecting the emitter (source) voltages of the first and second transistors to generate the detected voltage;
    an operational amplifier, for comparing the reference voltage with the detected voltage to generate an adjusting signal, wherein the positive end of the operational amplifier is coupled to the reference voltage generating circuit, and the negative end of the operational amplifier is coupled to the feedback voltage generating circuit; and
    a bias circuit, coupled to the operational amplifier, for adjusting the differential input signal according to the adjusting signal.

3. The transconductor circuit as claimed in claim 2, further comprising:
    a first input capacitor, coupled between the first transistor and the first input end; and
    a second input capacitor, coupled between the second transistor and the second input end.

4. The transconductor circuit as claimed in claim 2, wherein the feedback voltage generating circuit comprises:
    a first resistor, one end of the first resistor is coupled to the emitter (source) end of the first transistor and the other end is coupled to the negative input end of the operational amplifier;
    a second resistor, one end of the second resistor is coupled to the emitter (source) end of the second transistor and the other end is coupled to the negative input end of the operational amplifier; and
    a capacitor, one end of the capacitor is coupled to ground and the other end is coupled to the negative input end of the operational amplifier.

5. The transconductor circuit as claimed in claim 2, wherein the bias circuit comprises:
    a first bias resistor, one end of the first bias resistor is coupled to the base (gate) end of the first transistor and the other end is coupled to the out end of the operational amplifier; and
    a second bias resistor, one end of the second bias resistor is coupled to the base (gate) end of the second transistor and the other end is coupled to the out end of the operational amplifier.

6. The transconductor circuit as claimed in claim 2, further comprising:
    a first emitter (source) resistor, one end of the first emitter resistor is coupled to the emitter (source) end of the first transistor and the other end is coupled to ground; and
    a second emitter (source) resistor, one end of the second emitter resistor is coupled to the emitter (source) end of the second transistor and the other end is coupled to ground.

7. The transconductor circuit as claimed in claim 6, wherein the reference voltage generating circuit comprises:
    a reference resistor, one end of the reference resistor is coupled to ground and the other end is coupled to the positive input end of the operational amplifier; and
    a reference current source, coupled to the positive input end of the operational amplifier, for providing a predetermined current to generate the reference voltage.

8. The transconductor circuit as claimed in claim 7, wherein the reference resistor and the predetermined current are predetermined by the emitter (source) voltage of the first and second transistors without considering second-order inter-modulation distortion influence.

9. The transconductor circuit as claimed in claim 7, wherein the reference resistor is larger than both of the first and second emitter (source) resistors.

10. The transconductor circuit as claimed in claim 1, wherein the first and second transistors are one of BJTs and FETs.

11. A mixer for canceling second-order inter-modulation distortion, comprising:
a load circuit;
a switch circuit, coupled to the load circuit, comprising a first current path and a second current path; and
a transconductor circuit comprising a first transistor and a second transistor, for receiving a differential input signal, wherein the collector (drain) ends of the first and second transistors are respectively coupled to the first current path and the second current path and the base (gate) ends of the first and second transistors are respectively coupled to a first input end and a second input end; and
a negative feedback circuit, comprising an input end and an output end, for adjusting the voltage at the base (gate) ends of the first and second transistors according to a difference between a reference voltage and a detected voltage at the emitter (source) ends of the first and second transistors, wherein the input end is coupled to the emitter (source) ends of the first and second transistors and the output end is coupled to the base (gate) ends of the first and second transistors.

12. The mixer as claimed in claim 11, wherein the negative feedback circuit comprises:
a reference voltage generating circuit, for generating the reference voltage determined by the emitter (source) voltage of the first and second transistor without considering second-order inter-modulation distortion influence;
a feedback voltage generating circuit, for detecting the emitter (source) voltage of the first and second transistors to generate the detected voltage;
an operational amplifier, for comparing the reference voltage with the detected voltage to generate an adjusting signal, wherein the positive end of the operational amplifier is coupled to the reference voltage generating circuit, and the negative end of the operational amplifier is coupled to the feedback voltage generating circuit; and
a bias circuit, coupled to the operational amplifier, for adjusting the differential input signal according to the adjusting signal.

13. The mixer as claimed in claim 12, wherein, the transconductor circuit further comprising:
a first input capacitor, coupled between the first transistor and the first input end; and
a second input capacitor, coupled between the second transistor and the second input end.

14. The mixer as claimed in claim 12, wherein the feedback voltage generating circuit comprises
a first resistor, one end of the first resistor is coupled to the emitter (source) end of the first transistor and the other end is coupled to the negative input end of the operational amplifier;
a second resistor, one end of the second resistor is coupled to the emitter (source) end of the second transistor and the other end is coupled to the negative input end of the operational amplifier; and
a capacitor, one end of the capacitor is coupled to ground and the other end is coupled to the negative input end of the operational amplifier.

15. The mixer as claimed in claim 12, wherein the bias circuit comprises:
a first bias resistor, one end of the first bias resistor is coupled to the base (gate) end of the first transistor and the other end is coupled to the out end of the operational amplifier; and
a second bias resistor, one end of the second bias resistor is coupled to the base (gate) end of the second transistor and the other end is coupled to the out end of the operational amplifier.

16. The mixer as claimed in claim 12, wherein the transconductor further comprises:
a first emitter (source) resistor, one end of the first emitter resistor is coupled to the emitter (source) end of the first transistor and the other end is coupled to ground; and
a second emitter (source) resistor, one end of the second emitter resistor is coupled to the emitter (source) end of the second transistor and the other end is coupled to ground.

17. The mixer as claimed in claim 16, wherein the reference voltage generating circuit comprises:
a reference resistor, one end of the reference resistor is coupled to ground and the other end is coupled to the positive input end of the operational amplifier; and
a reference current source, coupled to the positive input end of the operational amplifier, for providing a predetermined current to generate the reference voltage.

18. The mixer as claimed in claim 17, wherein the reference resistor and the predetermined current are predetermined by the emitter (source) voltage of the first and second transistors without considering second-order inter-modulation distortion influence.

19. The mixer as claimed in claim 17, wherein the reference resistor is larger than both of the first and second emitter (source) resistors.

20. The mixer as claimed in claim 11, whereins the first and second transistor are one of BJTs and FET.

* * * * *